United States Patent [19]
Chuang et al.

[11] Patent Number: 5,837,583
[45] Date of Patent: Nov. 17, 1998

[54] METHOD OF FORMING SEPARATED FLOATING GATE FOR EEPROM APPLICATION

[75] Inventors: K.-J. Chuang, Peng Hu Hsien; H.-S. Lui, Hsinchu, both of Taiwan

[73] Assignee: Taiwan Semiconductor Manufacturing Co., Ltd., Hsinchu, Taiwan

[21] Appl. No.: 972,634

[22] Filed: Nov. 18, 1997

Related U.S. Application Data

[62] Division of Ser. No. 824,686, Apr. 8, 1997, Pat. No. 5,786,614.

[51] Int. Cl.⁶ .................................................. H01L 21/336
[52] U.S. Cl. ........................ 438/257; 438/258; 438/263; 438/264
[58] Field of Search .................... 438/257, 258, 438/259, 263, 264, 157, 158, 514, 526, 621

[56] References Cited

U.S. PATENT DOCUMENTS 4,162,176  7/1979  Tsuda ...................................... 438/257
5,296,397  3/1994  Lee ......................................... 438/257

*Primary Examiner*—Charles Bowers
*Assistant Examiner*—Jack Chen
*Attorney, Agent, or Firm*—Christensen, O'Connor, Johnson & Kindness PLLC

[57] ABSTRACT

An EEPROM with separated floating gate to reduce the antenna ratio is disclosed. The structure of the EEPROM includes field oxides formed on a wafer. A control gate is formed in the wafer. A first gate oxide formed above the wafer for isolation. A first polysilicon portion is formed on the first gate oxide, which includes a gate for a transistor, a first contact window and a floating gate. Further, the floating gate is set above the control gate. A second gate oxide is formed on the wafer adjacent to the field oxide for isolation. A tunneling window is formed in the second gate oxide. A second polysilicon portion having a second contact window is formed on the second gate oxide. A dielectric layer is formed on the first polysilicon portion and the second polysilicon portion. Contact holes are formed in the dielectric layer and a connecting structure formed in the contact holes and on the dielectric layer for interconnection.

2 Claims, 7 Drawing Sheets

METHOD OF FORMING SEPARATED FLOATING GATE FOR EEPROM APPLICATION

This is a divisional of the prior application Ser. No. 08/824,686, filed Apr. 8, 1997, the benefit of the filing date of which are hereby claimed under 35 U.S.C. § 120.

FIELD OF THE INVENTION

The present invention relates to an electrically erasable programmable read only memory (EEPROM) cell and, more particularly, to a cell structure with a separated floating gate.

BACKGROUND OF THE INVENTION

The erasable non-volatile memory market has been divided into four product segments. These include the EAROM (electrically alterable ROMs), EEPROM, EEPROM-EAROMs and non-volatile SRAMs (static RAMs). Different types of devices have been developed for specific applications requirements in each of these segments. The EEPROM is erased and programmed using electrical signals. The basic memory cell consists of an access transistor and a double polysilicon storage cell with a floating polysilicon gate isolated in silicon dioxide capacitively coupled to a second polysilicon control gate which is stacked above it.

For example, a FLOTOX (floating gate-tunnel oxide) includes a floating transistor and a select transistor. The select transistor in an EEPROM device is used to select individual EEPROM cells which are to be erased or programmed. The floating transistor in the EEPROM devices are those gates that actually perform the erase and program operations in the individual cells.

Currently, the basic technique used to perform the erase and program operations in the EEPROM is referred to as Fowler-Nordheim tunneling. Fowler-Nordheim tunneling is thought to be cold electron tunneling through the energy barrier at a silicon-silicon dioxide interface into the oxide conduction band. Many memory manufacturers choose a thin oxide floating gate process to make an electrically erasable PROM. The floating gate oxide is typically 50 nm thick, and the interpoly oxide is about 50 nm thick.

EEPROMs typically operate in a program mode, an erase mode, and a read mode. In the program mode, the source region is held at a high positive voltage and the control gate is held at a negative voltage. Consequently, the EEPROM cell is programmed by Fowler-Nordheim tunneling of electrons through the thin gate oxide between the floating gate and the source region of the cell. Electrons tunneling from the floating gate to the source region leave the floating gate relatively more positively charged. The positively charged floating gate shifts the threshold voltage of the memory cell in the negative direction so that in the read mode the transistor will be 'on'. The programmed state corresponds to a logical '0' state in the cell (see SEMICONDUCTOR MEMORIES: A Handbook of Design, Manufacture, and Application, B. Prince, Chapter 12).

In the erase mode, the control gate is held at high positive voltage while the drain region is grounded (i.e., coupled to a source of ground potential). Electrons tunnel through to the floating gate and the threshold voltage shifts in the positive direction so that in the read mode the transistor will be 'off'. The erased state corresponds to a logical '1' stored in the cell. In the read mode, the control gate is held at the integrated circuit supply voltage ($V_{cc}$), which would be lower than the threshold voltage of the EEPROM cell after being erased, but higher than the threshold voltage of the EEPROM cell after being programmed.

The thin tunneling oxide, generally about 10 nm, is usually isolated to a small area over the drain region, to facilitate tunneling. Programming is achieved by applying a high positive voltage to the drain region and the control gate and grounding the source region. Hot electrons generated in the channel are injected into the floating gate resulting in an upward shift in threshold voltage. Erasure is achieved by cold electron emission of electrons from the floating gate.

The fabrication of EEPROMs involves many processes that are well known in the prior art such as plasma etching, ion implantation and ashing. As is known, plasma processing causes gate oxide damage effects resulting from gate plasma etching processes. For example, the plasma nonuniformity leads to a local imbalance of ion and electron currents in the wafer surface. Typically, these mechanisms are plasma exposure damage due to bombardment by particles or photons or both and plasma charging damage. For insulating surfaces, the surface charges to reduce this imbalance and for thin oxides under the floating gate this results in tunneling currents which can degrade the oxide. For the asher used, the damage at the wafer center is due to excess electron current which causes negative gate charging and electron injecting from the gate into the oxide. A further description of these effects can by found in U.S. Pat. No. 5,548,224 to Gabriel et al. entitled Method and Apparatus for Wafer Level Prediction of Thin Oxide Reliability.

The etching processes will also cause the threshold voltage of a transistor to vary. Further, a transistor with a larger poly-Si antenna ratio has a larger threshold voltage shift than one with a smaller antenna ratio (see "Impact of Polysilicon Dry Etching on 0.5 µm NMOS Transistor Perform: The Presence of Both Plasma Bombardment Damage and Plasma Charging Damage", Tieer Gu, et al, IEEE, Vol.15, No. 2, 1994). As is known in the art, the antenna ratio is defined to be the ratio of the total polysilicon area covering the tunnel oxide and the total polysilicon area covering the thin oxide areas.

FIG. 1A illustrates a prior art top view of the layout of a floating gate 2 of an EEPROM. The floating gate 2 is on the right while the tunneling window 4 is on the left. A solid line denotes the active area of the memory cell. Outside the active area is an isolation region. A transistor 6 is formed between the floating gate 2 and the tunneling window 4. The floating gate 2 and the transistor 6 are formed of polycrystalline silicon. After the isolation region is manufactured, the tunnel window 4 is defined. The polycrystalline silicon region used to form floating gate 2 and transistor 6 is formed on the isolation region and aligned to the tunneling widow 4 by a mask. Impurity regions, contacts and metal lines may be formed after the floating gate 2 and transistor 6 are defined. Unfortunately, as can be seen, the conventional layout of the EEPROM shown in FIG. 1 has a large antenna ratio due to the large polycrystalline silicon region used to form the control gate, floating gate 2 and the transistor 6.

SUMMARY OF THE INVENTION

An EEPROM cell in a wafer having a separated floating gate comprises: a plurality of field oxides formed on said wafer for electrical isolation; a control gate formed in said wafer; a first gate oxide formed on said wafer for isolation; a first polysilicon portion formed on said first gate oxide including a gate for a transistor, a first contact window and a floating gate, said floating gate being above said control gate, said transistor being adjacent to said floating gate; a second gate oxide formed on said wafer adjacent to one of said field oxides; a tunneling window formed in said second gate oxide for carrier tunneling; a second polysilicon portion having a second contact window formed on said second gate oxide and covering said tunneling window; a dielectric layer formed on said first polysilicon portion and said second polysilicon portion; contact holes formed in said dielectric layer and being exactly over said contact windows; and a connecting structure formed in said contact holes and on said dielectric layer for interconnection.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A separated floating gate used for an EEPROM is disclosed herein to reduce the antenna ratio of the cell. Therefore, charge damage and threshold voltage shift will be reduced due to the lower antenna ratio.

Figure 1:
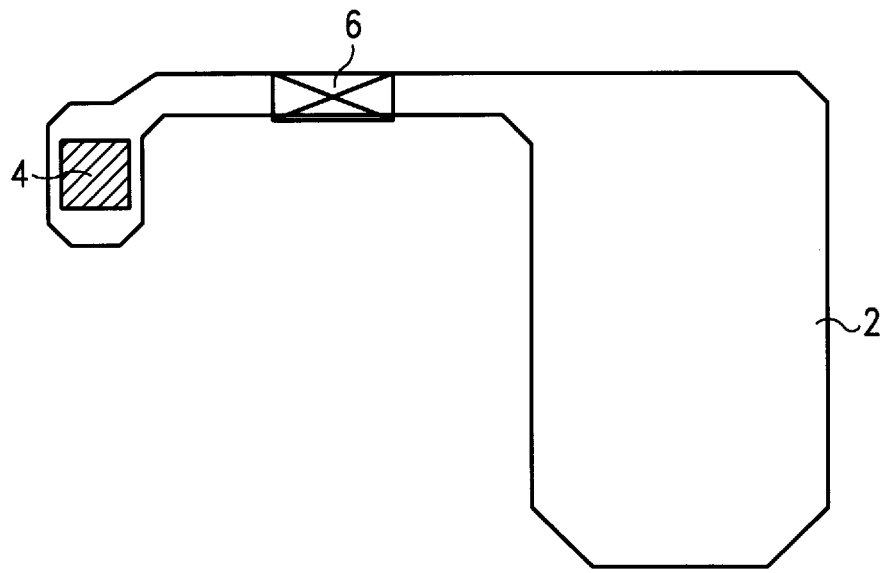
FIG. 1 is a top view of a layout of a prior art floating gate.
Figure 2:
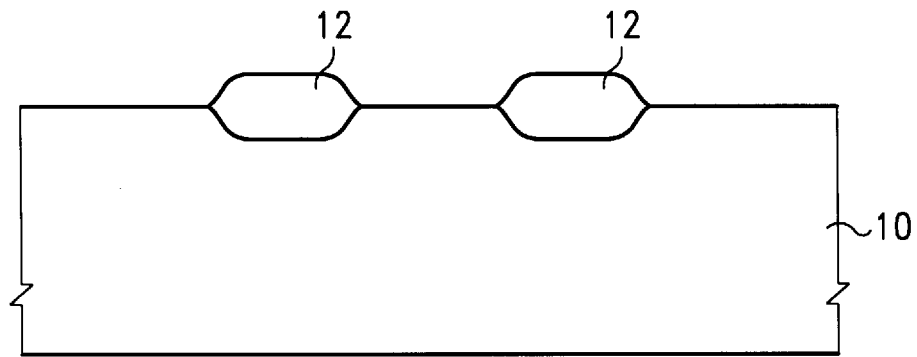
FIG. 2 is a cross section view of a semiconductor wafer illustrating the step of forming field oxide regions in accordance with the present invention.

As will be seen below, many techniques well known in the art can be used to form one embodiment of an EEPROM cell in accordance with the present invention. Referring to FIG. 2, in this embodiment, a single crystal substrate 10 with a <100> crystallographic orientation is used. First, thick field oxide regions (FOX) 12 are formed for the purpose of electrical isolation between active regions. The FOX 12 regions are created via photolithography and dry etching steps to etch a silicon nitride-silicon dioxide composite layer. After the photoresist is removed and wet cleaned, a thermal oxidation in an oxygen ambient is used to form the FOX 12 regions, to a thickness about 4000–6000 angstroms.

Figure 3:
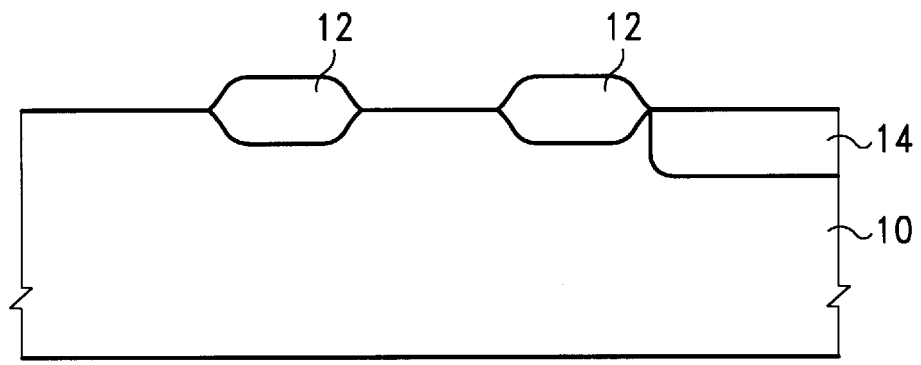
FIG. 3 is a cross section view of a semiconductor wafer illustrating the step of forming a control gate in accordance with the present invention.

Turning to FIG. 3, a control gate region 14 is defined by a mask pattern on the substrate 10. Subsequently, an ion implantation is performed to dope the n-type or p-type impurities into the control gate region thus forming the control gate 14. The source of the implantation may be any suitable ion, such as phosphorous ($P^+$) or arsenic ($As^+$). The mask is removed after the ion implantation is done.

Figure 4:
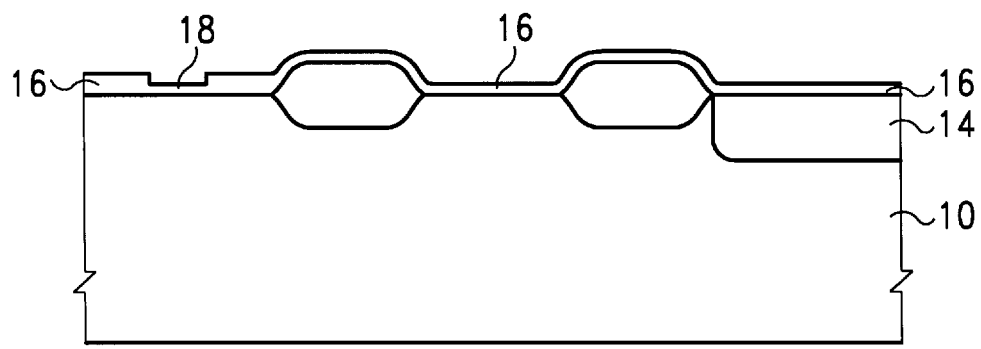
FIG. 4 is a cross section view of a semiconductor wafer illustrating the step of forming a gate oxide and a tunneling oxide in accordance with the present invention.

Turning next to FIGS. 4, a gate oxide layer 16 is formed on the substrate 10 by using an oxygen ambient, at a temperature between about 850° to 1000° C., for 5–15 minutes. The thickness of the oxide 16 is about 120–220 angstroms. Then, a tunneling window 18 is defined using well known prior art technology. Typically, the thickness of the tunnel window is in the range of 50–105 angstroms. In this case, the tunneling oxide is formed by subsequent thermal oxidation process. It is appreciated that other methods of forming the oxide can also be used.

Figure 5:
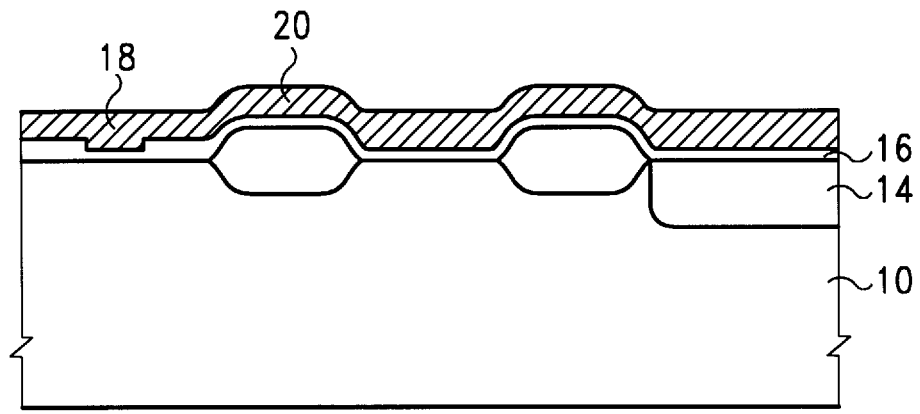
FIG. 5 is a cross section view of a semiconductor wafer illustrating the step of forming a polysilicon layer on the gate oxide in accordance with the present invention.

Turning to FIG. 5, a polysilicon layer 20 is then formed over the gate oxide layer 16, the tunnel window 18, the substrate 10 and the field oxide regions 12. The polysilicon layer 20 is formed using conventional chemical vapor deposition (CVD). It can be appreciated that other methods of depositing the polysilicon layer 20 can also be used. The thickness of the polysilicon layer 20 is optimally 1000–3000 angstroms. In this embodiment, the polysilicon layer 20 is chosen from doped polysilicon or in-situ doped polysilicon. Further, the polysilicon layer is utilized to define a floating gate and a transistor.

Figure 6A:
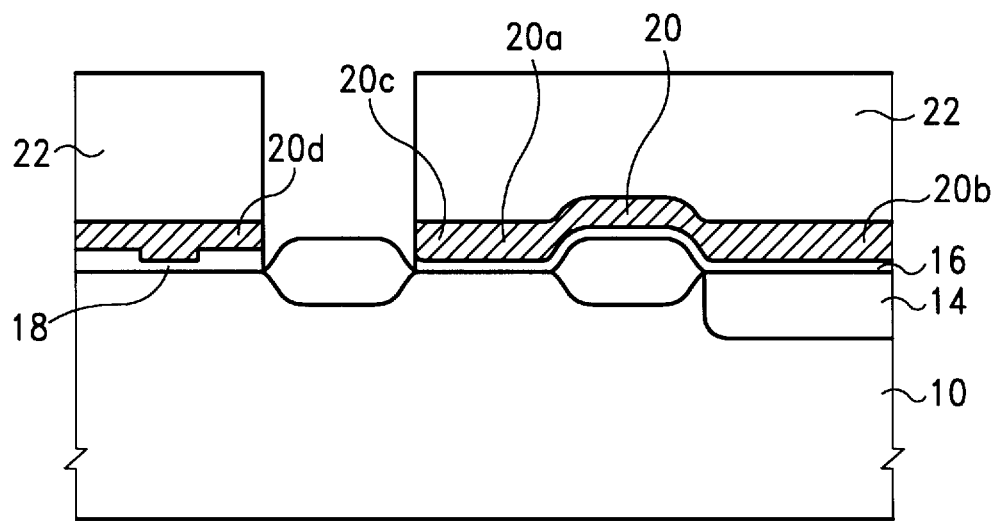
FIG. 6A is a cross section view of a semiconductor wafer illustrating the step of separating the polysilicon layer and forming source/drain regions of a transistor in accordance with the present invention.
Figure 6B:
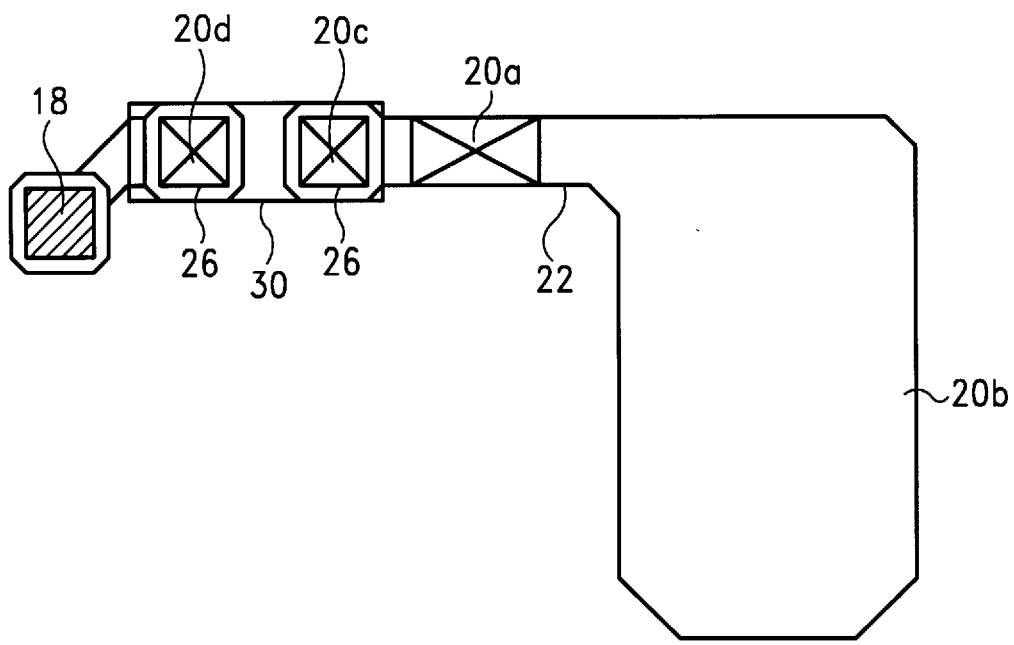
FIG. 6B is a top view of the floating gate formed in accordance with the present invention.

Turning next to FIGS. 6A and 6B, a photoresist 22 is patterned on the polysilicon layer 20 to define the floating gate. The floating gate will be seperated by subsequent process. Using the photoresist 22, the polysilicon layer 20 is cut into two portions. One of the portions includes a gate for a transistor 20a, a floating gate 20b and a region used to define a first contact window 20c. Another portion exactly covers the tunneling window 18 and is used to form a second contact window 20d during a subsequent process. Then, the source and drain regions (not shown) are generated by means of a well known doping process. Then, the photoresist 22 is removed.

Figure 7:
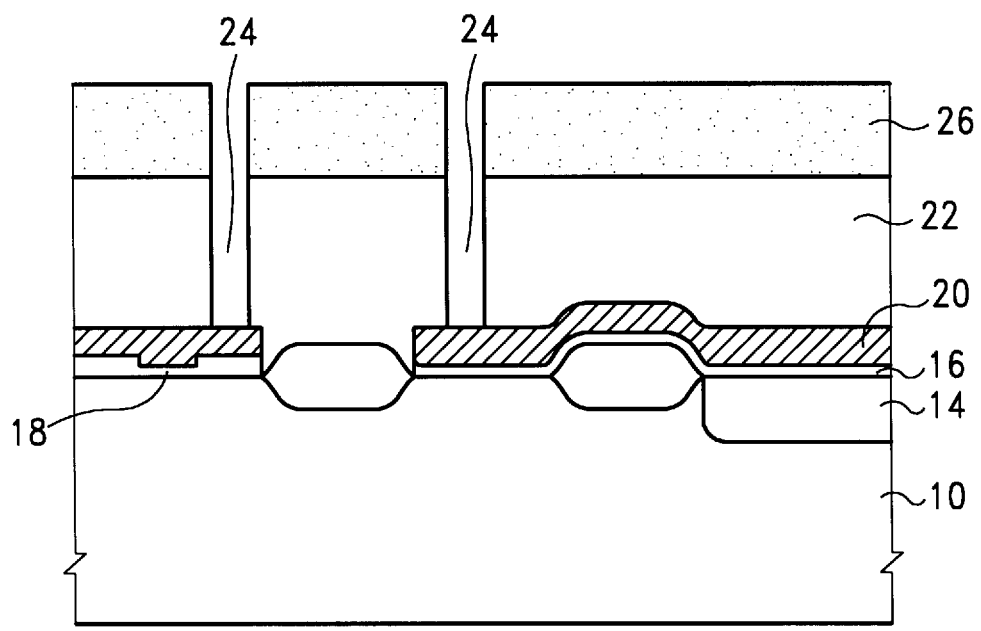
FIG. 7 is a cross section view of a semiconductor wafer illustrating the step of forming contact holes in accordance with the present invention.

Next, referring to FIG. 7, a dielectric layer 23 is formed on the polysilicon layer 20 and the field oxide 12. An etching process is then carried out to form contact holes 24 by using an etching mask 26. The etching mask 26 exposes the dielectric layer 23 that is exactly over the contact windows 20c, 20d in FIGS. 6A and 6B. The etching mask 26 is then removed after the contact holes 24 are formed. The thickness of the dielectric layer is about 3500 to 15000 angstroms. In the preferred embodiment, the dielectric layer 23 is composed of silicon dioxide or silicon nitride.

Figure 8:
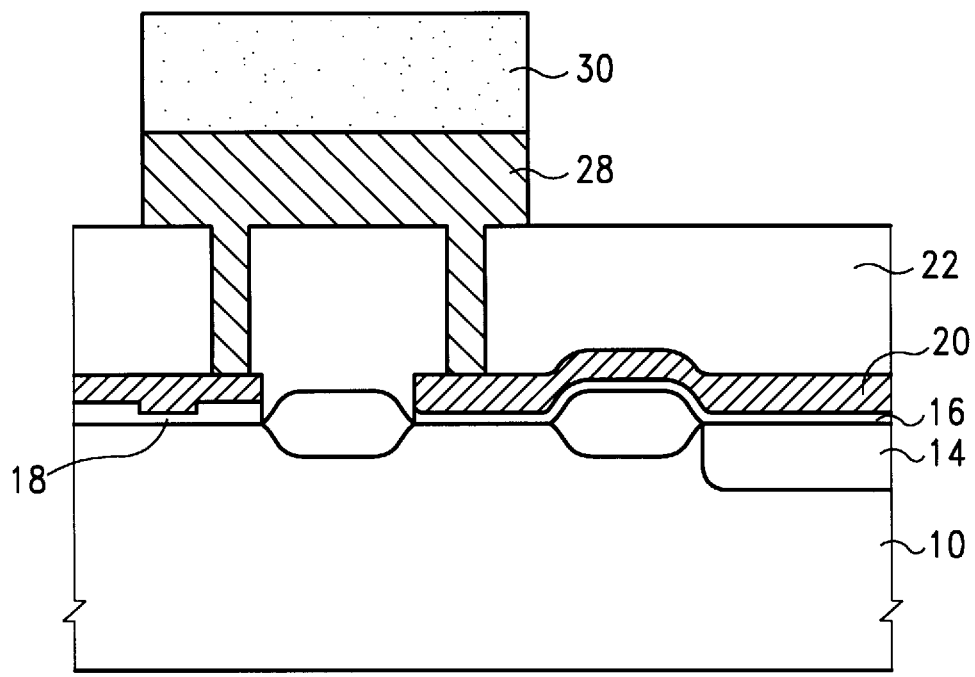
FIG. 8 is a cross section view of a semiconductor wafer illustrating the step of forming a metal connection in accordance with the present invention.

Referring to FIG. 8, metal plugs 27 are formed in the contact holes 24 by well known plug forming process. A metal layer 28 is subsequently formed on the dielectric layer 23 for interconnection. Then the metal layer 28 is etched by a mask 30 to define the interconnection. Referring to FIG. 6B, the mask 30 covers the region that is over and between the two contact windows 20c, 20d. The mask 30 is removed away after the metal layer 28 is formed. The antenna ratio of the EEPROM device is decreased due to the separated floating gate structure of the present invention. In other words, the antenna ratio is decreased by reducing the area of the polysilicon layer 20 which is connected with tunnel window during the process of poly etching and ashing.

Figure 9A:
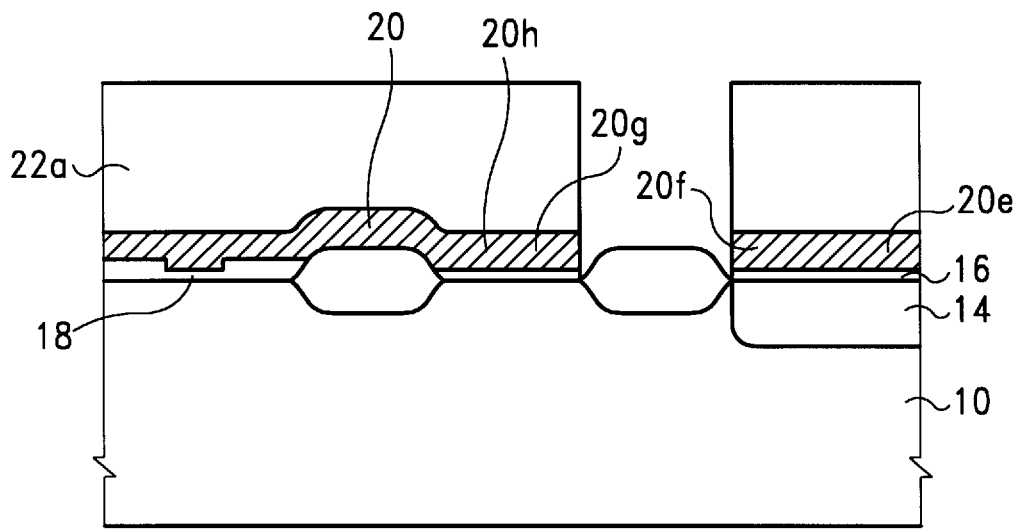
FIG. 9A is a cross section view of an alternative embodiment of a semiconductor wafer illustrating the step of separating the polysilicon layer and forming source/drain regions of a transistor in accordance with the present invention.
Figure 9B:
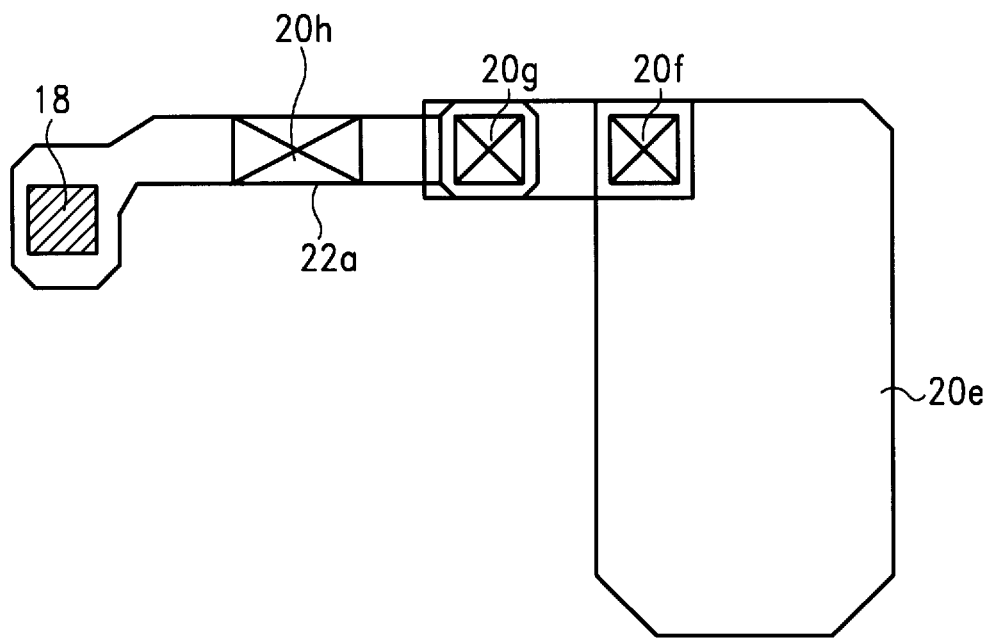
FIG. 9B is a top view of the alternative embodiment of the floating gate in accordance with the present invention.

An alternative embodiment of the present invention is now described. Most of the process are the same as with the first embodiment of the present invention except the steps of separating the polysilicon layer 20 and forming the contact holes. Referring to FIGS. 9A and 9B, a mask 22a is used to pattern the polysilicon layer 20 to define a separated floating gate. Similarly, the polysilicon layer 20 is divided into two portions. A first portion includes a floating gate 20e, and a region used to define a contact window 20f. The second portion exactly covers the tunneling window 18 and includes a region used to form a contact window 20g and a gate for a transistor 20h. Then, the source and drain regions (not shown) are generated by a well known doping process.

Figure 10:
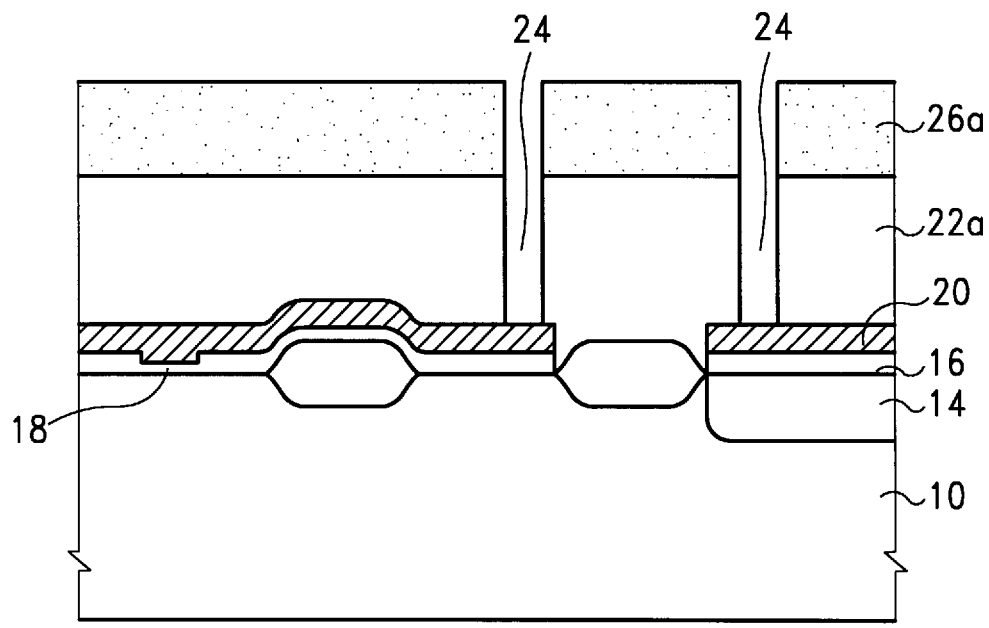
FIG. 10 is a cross section view of the second embodiment of a semiconductor wafer illustrating the step of forming contact holes in accordance with the present invention.

Next, referring to FIGS. 10, a dielectric layer 23a is formed on the polysilicon layer 20 and the field oxide 12. An etching process is used to form contact holes 24 by using a mask 26a. The mask 26 covers dielectric layer 23a except the region that is exactly over the contact windows 20f, 20g in FIG. 9B. The composition and thickness of the dielectric layer is the same as with the first embodiment. The mask 26a is removed after the contact holes 24a are formed.

Figure 11:
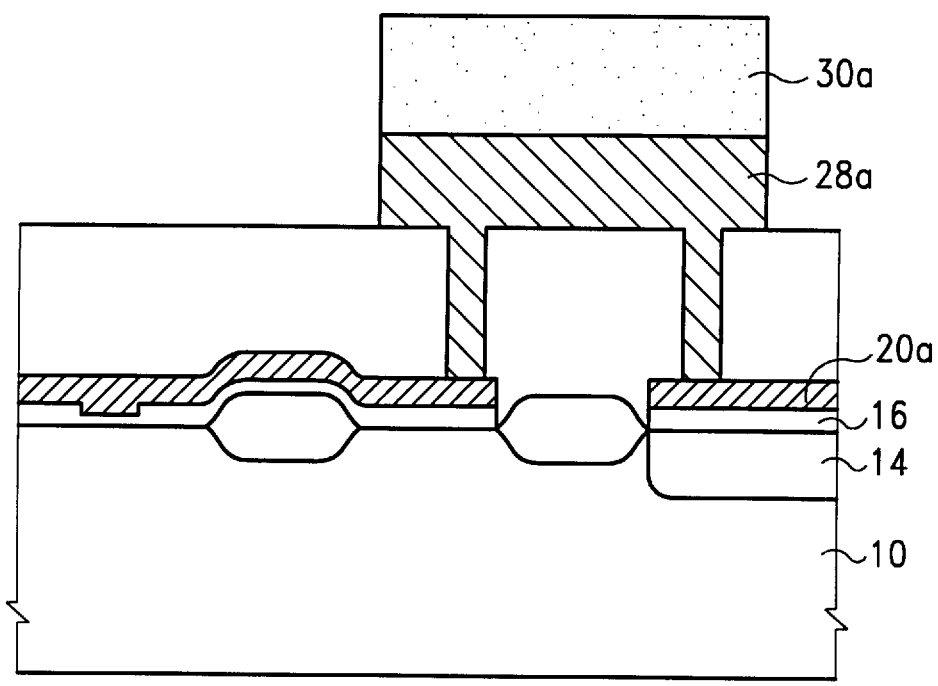
FIG. 11 is a cross section view of the alternative embodiment of the semiconductor wafer illustrating the step of forming a metal connection in accordance with the present invention.

Referring to FIG. 11, similarly, metal plug 27a and a metal layer 28a are respectively formed in the contact holes 24 and on the dielectric layer 23a for serving as an interconnection. Then the metal layer 28 is etched by using a mask 30a. Referring to FIG. 9B, the mask 30a covers the region that is over and between the two contact windows 20f, 20g. Then the mask 30a is stripped away.

As can be understood by those skilled in the art, the foregoing preferred embodiment of the present invention is illustrative of the present invention rather than limiting of the present invention. For example, the transistor can be formed with the floating gate or, alternatively, with the tunneling window region. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a EEPROM having a separated floating gate on a wafer, said method comprising:

forming a control gate in said wafer by ion implantation;

forming a gate oxide layer on said wafer;

forming a tunneling window in a portion of said gate oxide;

forming a polysilicon layer on said gate oxide and said tunneling window;

separating said polysilicon layer into a first portion and a second portion using a first mask, wherein said first portion is used to define a gate of a transistor, a first contact window and a floating gate, and wherein said second portion is used to define a second contact window;

removing said first mask;

forming a dielectric layer on said polysilicon layer;

patterning and etching said dielectric layer using a second mask to define a first contact hole and a second contact hole, wherein said first contact hole is connected to said first contact window and wherein said second contact hole is connected to said second contact window;

removing said second mask; and forming a metal layer in said first contact hole, second contact hole and on said dielectric layer.

2. The method of claim 1 further including the steps of:

patterning a third mask on said metal layer;

etching said metal layer by using said third mask; and stripping said third mask.

* * * * *